United States Patent [19]

Perotto et al.

[11] 4,047,010
[45] Sept. 6, 1977

[54] MULTI-FUNCTIONAL ELECTRONIC WATCH

[75] Inventors: Jean Félix Perotto, Neuchatel; Eric Vittoz, Cernier, both of Switzerland

[73] Assignee: Centre Electronique Horloger S.A., Neuchatel, Switzerland

[21] Appl. No.: 607,924

[22] Filed: Aug. 26, 1975

[30] Foreign Application Priority Data

Sept. 4, 1974 Switzerland .................. 12036/74

[51] Int. Cl.² .................. G06F 7/38; G04B 47/00; G06K 9/10
[52] U.S. Cl. .................. 235/156; 58/50 R; 58/152 R; 340/146.3 SY
[58] Field of Search .......... 235/156; 58/50 R, 152 R; 340/146.3 SY

[56] References Cited

U.S. PATENT DOCUMENTS

| | | | |
|---|---|---|---|
| 3,108,254 | 10/1963 | Dimond | 340/146.3 SY |
| 3,803,834 | 4/1974 | Reese | 58/152 R |
| 3,903,502 | 9/1975 | Moss | 340/146.3 SY |
| 3,909,785 | 9/1975 | Howells | 340/146.3 SY |
| 3,928,960 | 12/1975 | Reese | 235/156 X |
| 3,930,229 | 12/1975 | Crane | 340/146.3 SY |

*Primary Examiner*—Jerry Smith
*Attorney, Agent, or Firm*—Imirie & Smiley

[57] ABSTRACT

A multifunctional wrist watch combining the functions of time-indication with other functions, for example a calculator. The watch has a glass in which pick-ups are provided for detecting the passage of a finger of a user over the surface of the glass and recognition circuits for converting the trace detected into a logic signal for processing by a calculator circuit provided in the watch case. The output of the calculator is then displayed by the electro-optical display on the watch. The detection and recognition facility may also be utilized for correction of the date and time settings of the watch.

13 Claims, 29 Drawing Figures

| 0 | 1 | 2 | 3 | 4 |
|---|---|---|---|---|
| 1 | 0 | 1 | 0 | 0 |
| 2 | 0 | 0 | 1 | 0 |
| 3 | 0 | 0 | 0 | 1 |
| 4 | 1 | 0 | 0 | 0 |
| 5 |   |   |   |   |
| 6 |   |   |   |   |

| 9 | 1 | 2 | 3 | 4 |
|---|---|---|---|---|
| 1 | 0 | 1 | 0 | 0 |
| 2 | 0 | 0 | 1 | 0 |
| 3 | 0 | 0 | 0 | 1 |
| 4 | 1 | 0 | 0 | 0 |
| 5 | 1 | 0 | 0 | 0 |
| 6 | 0 | 0 | 0 | 1 |

| 9 | 1 | 2 | 3 | 4 |
|---|---|---|---|---|
| 1 | 0 | 0 | 0 | 1 |
| 2 | 1 | 0 | 0 | 0 |
| 3 | 0 | 1 | 0 | 0 |
| 4 | 0 | 0 | 1 | 0 |
| 5 | 0 | 0 | 0 | 1 |
| 6 |   |   |   |   |

| = | 1 | 2 | 3 | 4 |
|---|---|---|---|---|
| 1 | 0 | 0 | 0 | 1 |
| 2 | 0 | 0 | 0 | 1 |
| 3 |   |   |   |   |
| 4 |   |   |   |   |
| 5 |   |   |   |   |
| 6 |   |   |   |   |

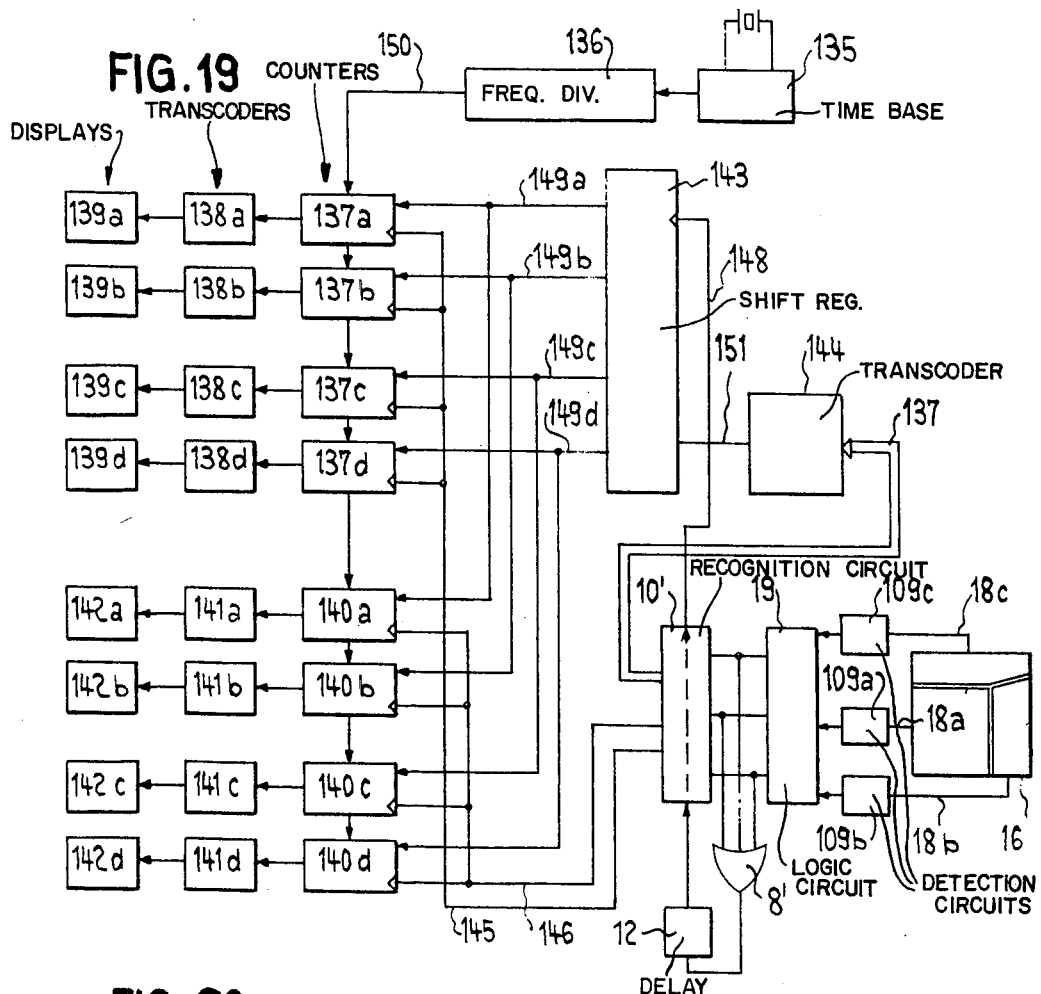
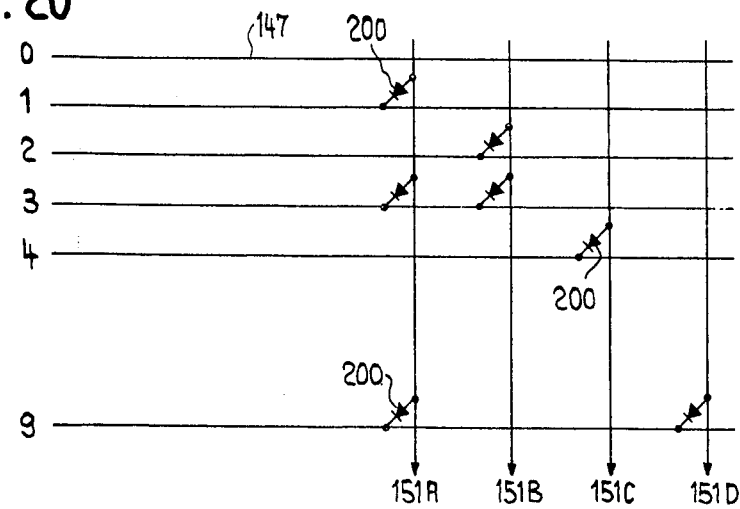

MULTI-FUNCTIONAL ELECTRONIC WATCH

BACKGROUND OF THE INVENTION

The present invention has for its subject a multi-functional electronic watch provided with electro-optical display means.

One part of the circuit and the display means of an electronic watch can be used to many ends. That is why it has already been envisaged to provide an electronic watch with other functions, whether or not related to measurement of time. These are multi-functional watches.

The exploitation of the associated functions is limited by the difficulties encountered in making a device permitting instructions, and for data to be input, for example, of an alpha-numeric character, which is suitably versatile to allow suitable dialogue between the user and the instrument. A device of this type must therefore satisfy the following conditions:

a. entering of a relatively large amount of data on a small writing surface;
b. relatively short entry time;
c. introduction of data by a simple manual operation not necessitating lengthy training on the part of the operator.

There is known [from U.S. Pat. No. 3,803,834 (Time computer)] a watch-calculator comprising a mini-keyboard for introducing instructions and data, the display means for time being used to display the result of a calculation. The selection of the function "watch" or "calculator" is carried out by means of a push-button. Each piece of data is introduced with the aid of a specific key: the size of human fingers limits miniaturization of the keys and, consequently, the number of keys that it is possible to provide on a given surface. On the other hand, the use of a tool or of another accessory is a poor alternative, of little interest.

In other known devices (see, for instance, U.S. Pat. No. 3,823,545 the entering of data is performed by selection of symbols corresponding to an alphabet which is sequentially displayed to the operator. This method has the inconvenience of necessitating a relatively long entry time when usable alphabet is important.

Other solutions (for instance U.S. Pat. No. 3,810,356 interpose a keyboard having a reduced number of keys, keyboard which implies, if the amount of data is large, a difficult training on the part of the user.

One solution approaching the techniques of pattern recognition seems better adapted to the solution of the entering of data in an instrument of small volume, as the entering datum is no longer selected individually but recognized thanks to the writing of a symbol which the user traces on an appropriate surface forming part of the casing of the instrument.

A known manner [see "The Strengths of Optical-Character Recognition," G. Pick Telecommunications, March 1972, pp. 23-27) of recognizing alpha-numeric characters consists in comparing, point by point, the writing of the symbol entered with a set of pre-inscribed symbols, the algorithm which permits recognition of the traced symbol is complex.

It is more rational to imagine a form of recognition device where there is extracted a part of the information which provides the writing sequence. A device of this type is know [see French Pat. No. 2,204,314 (Thomson-CSF)], constituted by a skew surface plate presenting at least two raised portions disposed in a manner such that they form a type of groove along which the finger of the operator can slide in writing a character, transducers being associated with this plate to transform the writing of the character, in the course of its inscription, into a series of electric signals delivered when the finger passes.

It is difficult to use this entering device for information into a multi-functional watch: the available writing surface being small, the number of transducers must be restrained with respect to the usable alphabet. Moreover, the surface has to remain nearly flat.

The object of the invention is to make a multi-functional electric watch with an entering device for data satisfying conditions (a), (b), (c) above.

SUMMARY OF THE INVENTION

According to the present invention there is provided a multi-functional electronic watch having electro-optical display means, including a data processing circuit, a writing surface comprising a plurality of pick-up electrodes embedded in the glass of said watch, interface means connecting said pick-up electrodes to said processing circuit, so that symbols traced on said writing surface corresponding to data to be processed and to instructions for processing are supplied to said data processing circuit.

The entering device for data thus permits recognition, amid a limited and predetermined alphabet, of the entering data thanks to the information provided by the sequence corresponding to the manual tracing of the symbol associated with the entering data.

BRIEF DESCRIPTION OF THE DRAWINGS

Advantages of the present invention will become apparent upon consideration of the following description when taken in conjunction with the accompanying drawings in which:

FIG. 19 represents a block diagram of an electronic watch using the data entering device as means for correction of the hour and of the date;

FIG. 20 is a diagram of a part of the transcoder;

DETAILED DESCRIPTION

Figure 1:
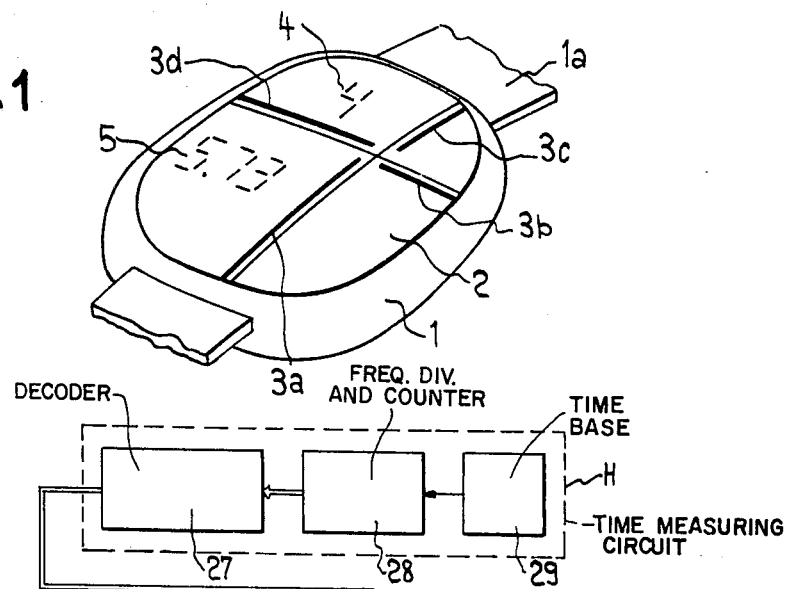
FIG. 1 is a perspective view of a multi-functional wrist watch combining the functions of time-indication with the function of a calculator and being provided with a device permitting the entry of data for the calculator.

The instrument illustrated in FIG. 1 permits measuring or indicating the time and the processing of informations. Its appearance is similar to that of a conventional wrist watch 1 provided with electro-optical display means 4 and 5. To enter data or an instruction the operator traces a symbol, with a finger, on the surface of glass 2 of the watch. The glass 2 is provided with pick-ups 3a, 3b, 3c, 3d, which detect the passage of a finger of the operator and subsequently furnish impulses the sequence of which correspond univocally to the traced symbol.

Figure 2:
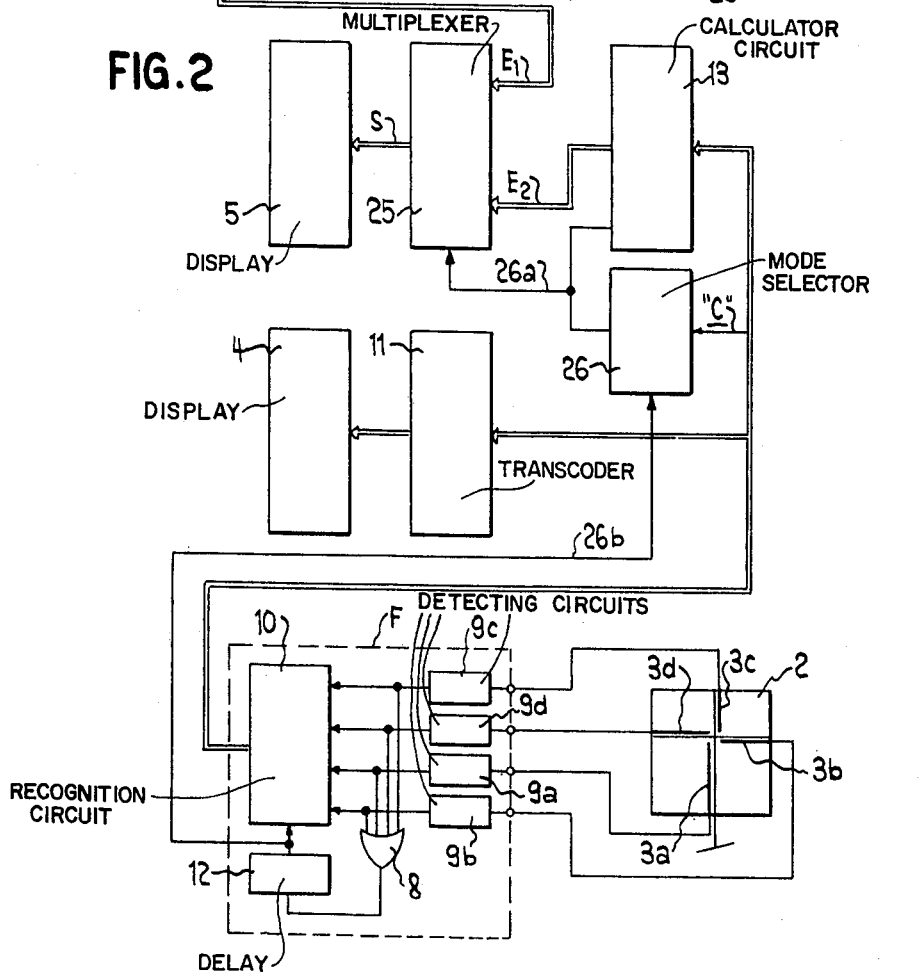
FIG. 2 is a block diagram of the circuit associated with the wrist watch of FIG. 1.

FIG. 2 shows a block diagram of the instrument in the case where the circuit for treatment of information is a calculator. For controlling this calculator it must be possible to introduce the numeric symbols 0, 1, 2 ... 9 and the instructions +, −, ×, ÷, = and C (clear).

The pick-ups 3a, 3b, 3c and 3d are connected to circuits 9a, 9b, 9c and 9d, for detecting and putting the signals into proper form for driving a recognition circuit 10, the outputs of which correspond in number equal to the number of symbols which it is possible to enter. The outputs of circuit 10 are applied in parallel to a transcoder 11 and the information processing circuit 13 which in this case is a "4 operations" calculator, such as, for example, the TMS 0100 NC calculator circuit of Texas Instruments. For controlling this calculator by the circuit 10 it is necessary to replace the circuit breaker normally associated with each key of the keyboard (normal control) by a transistor (for example MOS type N). The transistor corresponding to the data to be entered is made conducting (control electrode to the state 1), all the other transistors being blocked. It is thus possible to control the calculator by means of a recognition circuit 10. The transcoder 11, composed of a matrix of diodes, controls an electronic display 4 having 16 segments serving the controlling of the entering data.

The circuit 13 provides one of the inputs $E_2$ of a multiplexer 25, the other input $E_1$ of which is provided by a circuit H for measuring time composed of a quartz crystal time base 29, frequency divider and counter circuit 28 and a decoder 27. The output S of the multiplexer 25 controls the display 5 comprising nine "7 segment" digits. The initiation of the circuit 10 is effected a certain time after the end of the writing sequence of a symbol by means of a delay 12 controlled by a four input OR gate 8.

The circuit 8, 9a, 9b, 9c, 9d, 10 and 12 constitutes the interface F.

Figure 3:
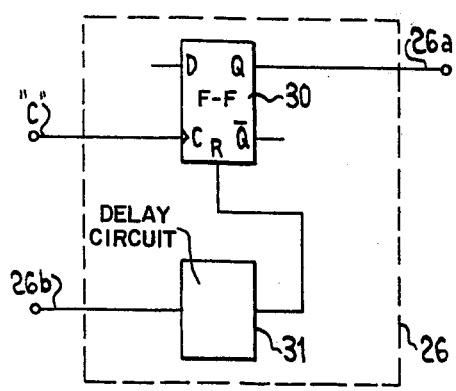
FIG. 3 is a diagram of the function selector for the watch or calculator.

The display 5 is thus used to display the time when the time function is selected and for displaying the results of calculations when the calculator function is selected. This selection is carried out by the circuit 26 shown in FIG. 3. When the user desires to use the calculator function, he traces the symbol "C" (clear) which has the effect of connecting the calculator 13 and selecting its display 5 via the multiplexer 25. The time function is automatically substituted for the calculator a certain time T' after the last arithmetic operation has been effected.

Figure 4:
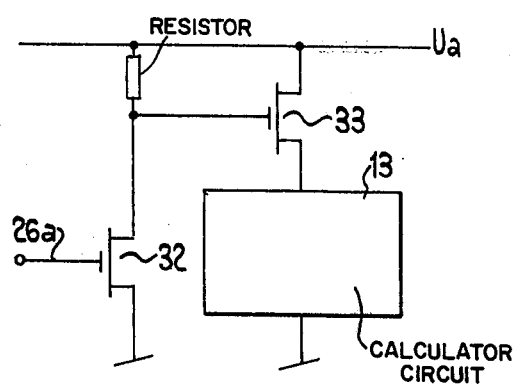
FIG. 4 shows the device for energizing the calculator.
Figure 5:
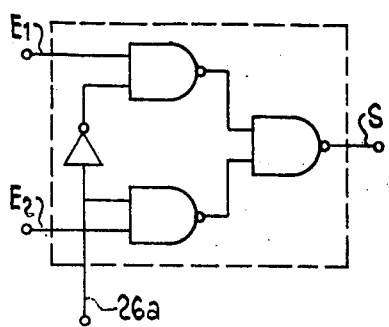
FIG. 5 is a element of the multiplexer.

The circuit 26 (see FIG. 3) is composed of a D-type flip-flop 30 (reference C-MOS 74C 74) the clock input C of which is controlled by the line C of the circuit 10 which assumes the state 1 when this symbol is traced. The output Q of the flip-flop 30 controls the selection input of the multiplexer 25 via the line 26a one cell of which multiplexer is described in FIG. 5, and also controls a device for energizing of the calculator 13 as represented in FIG. 4. This energizing device comprises two transistors 32 and 33 one of which is controlled by the output Q of the flip-flop 30 the other is used as a switch for the supply voltage $U_a$ of the calculator 13.

The delay circuit 31 (FIG. 3) is similar to the delay circuit 12 but presents a larger delay T', of the order of 1 minute. As long as the symbols are traced on the writing surface, the delay circuit 31 receives impulses which maintain its output to the state 1. At the time T' after the entry of the last symbol, its output passes to the state zero which has the effect of resetting the flip-flop 30 into the state $Q = 0$, thus engaging the time function.

There is thus avoided the use of an additional mechanical commutator for switching from the watch function to the calculator function.

The automatic return of the time function with releasing of the calculator without the intervention of the user presents the advantage of reducing the energy consumption.

The time measuring circuit H, the recognition circuit ten, the selection circuit 26 and the multiplexing circuit 25 are reliable using complimentary MOS transistors, these last three circuits using about 200 NAND gates.

In a different embodiment, the transcoder 11 and the display 4 can be omitted, the control of the entering data being then effected by the display 5.

Figure 7:
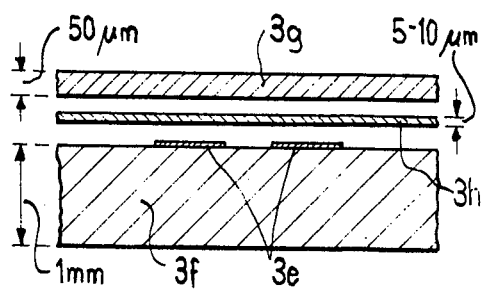
FIGS. 7, 8, 9 and 10 show details of construction which illustrates the principles of construction of the pick-ups.
Figure 8:
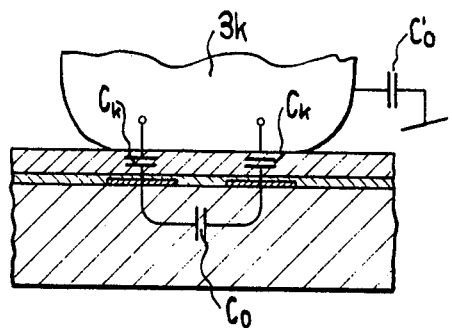

FIG. 7 shows a practical embodiment of the pick-ups 3a, 3b, 3c, 3d which in a first embodiment are capacitors. The electrodes 3e are formed by a deposit of zinc oxide on ordinary glass of a thickness in the region of 1 mm to ensure the mechanical rigidity of the writing surface. A plastic film 3h (thickness 5 - 10 μm) of cellulose acetate and a glass plate 3g (thickness 50 μm) cover the electrodes, the whole being assembled at a temperature 300° C under pressure. The assembly of plastic film 3h and glass 3g protects the electrodes and constitutes the dielectric of the capacitors $C_K$ (see FIG. 8) which are formed between the electrodes 3e and 3e and a finger 3k of the operator. $C_o$, $C'_o$ are stray capacitances.

Figure 6:
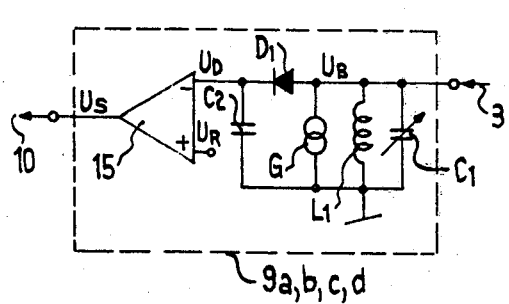
FIG. 6 shows the circuit for detection and triggering the output signals of capacitive pick-ups.

FIG. 6 shows one of the circuits 9 for detecting and putting the signal into proper form (9a, 9b, 9c or 9d) composed of a filter $L_1C_2$ driven at resonance by a current generator G and a detector $D_1C_2$ the output of which is connected to a voltage comparator 15 providing a logic signal.

The presence of a finger near one pair of electrodes 3a, 3b, 3c or 3d of one of the pick-ups provokes a variation of capacitance between the electrodes. This capacitance of the order of 2 pF in the absence of a finger and of 2.2 pF with the finger, is in parallel with the variable capacitance $C_1$ (2 pF) forming with $L_1$ (2.8 mH) a stopper circuit which, driven by alternating current by the generator G, develops an alternating voltage $U_B$ at its output. In the proximity of resonance ($f = 1,5$ MHz), this voltage varies greatly with the value of the capacitance of the pick-up. $U_B$ applied to the detector $D_1C_2$ provides a direct voltage $U_D = U_B$, which is a function of the presence or the absence of a finger in the region of one of the pick-ups of the writing surface. The voltage $U_D$ is compared to a reference voltage $U_R$ by means of comparator 15 which provides a voltage $U_s$ at its output such as: $U_s = 0$ if $U_D > U_R$ (absence of finger) = logical state 0 $U_s = U_{Battery}$ if $U_D < U_R$ (presence of a finger) = logical state 1

The outputs from the comparators control the recognition logic circuit 10.

FIGS. 11, 12, 13, and 14 show several examples of symbols and instructions such as they must be traced to be recognized. When each tracing is made, the finger of the operator crosses the pick-ups in given order so that, at the output of the collectors, a series of combination codes are provided. To each symbol corresponds univocally a sequence formed by a certain number of steps (1 to 6) having four bits.

Figure 15:
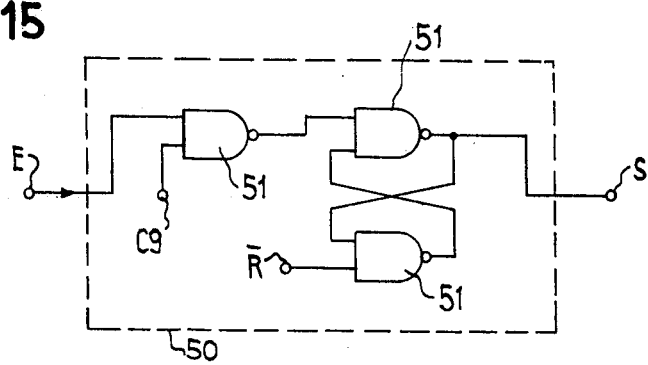
FIGS. 15 and 16 are elementary units of the circuit of FIG. 17.
Figure 16:
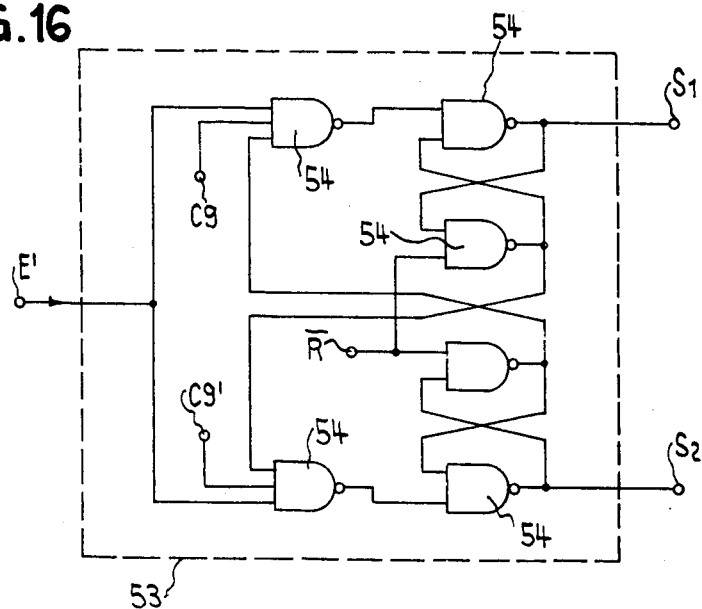
Figure 17:
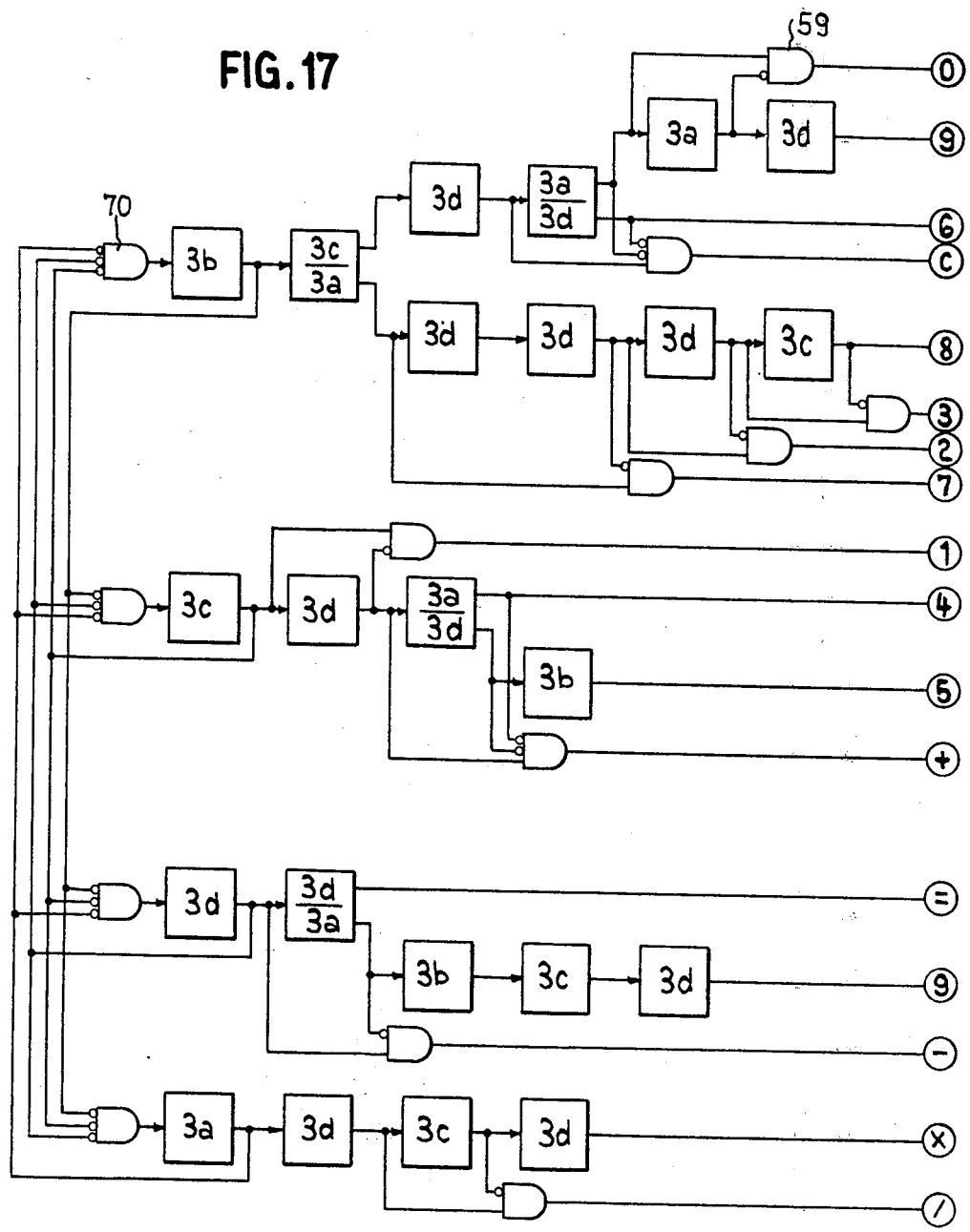
FIG. 17 shows a block diagram of the recognition circuit 10 of FIG. 2.

The recognition circuit 10 represented in FIG. 17 consists of an assembly of elementary units grouped in two categories:

simple units (FIG. 15)

switching units (FIG. 16).

Figure 28:
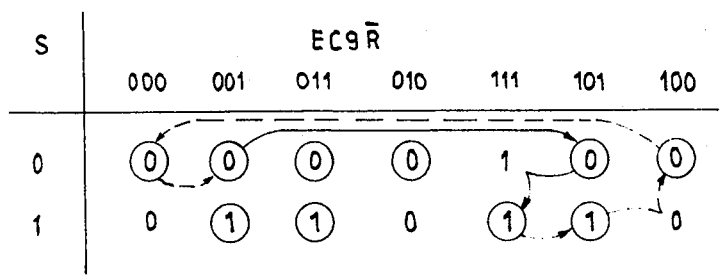
FIGS. 28 and 29 show the tables of the states of the elementary units which constitute the logic circuit of FIG. 17.
Figure 29:
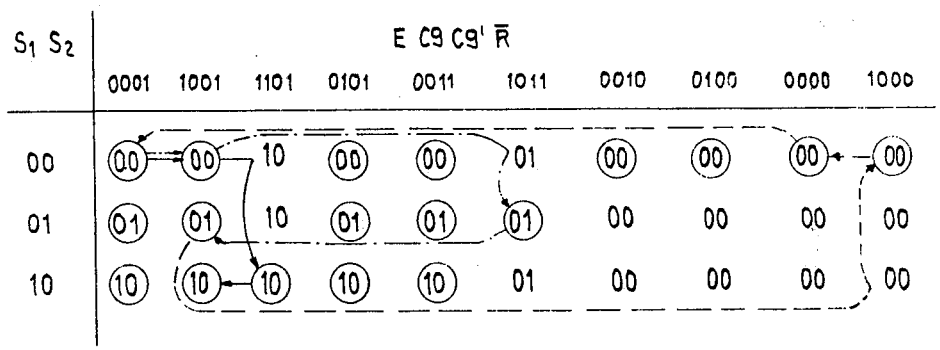

The simple unit 50 is composed of three NAND gates 51 forming an RS flip-flop with a control gate. This unit is controlled by three distinct variables: the input E connected to the output of the preceding unit, the input C9 (a, b, c or d) controlled by one of the four pick-ups and the zeroing input $\overline{R}$. The state table of this unit is given by FIG. 28 where there is shown a sequence of use: the full line corresponds to the activation of the unit, the broken line to the return-to-zero, The switching unit 53 (see FIG. 16) is composed of six NAND gates 54 mounted as a double RS flip-flop with a control gate. This unit is controlled by four variables: the input E' connected to the output of the preceding unit, two inputs C9 and C9' controlled by two pick-ups and the return-to-zero input $\overline{R}$. FIG. 29 represents the state table of this cell with one sequence of use where the full line corresponds to the collector C1 activated, the chain dotted line to the activation of the collector C2 and the broken line to the return-to-zero.

Figure 12:
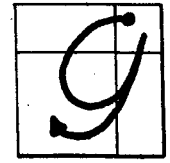
Figure 13:
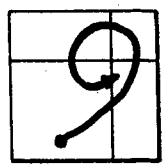
Figure 14:
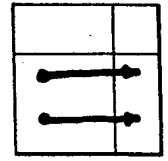
Figure 18:
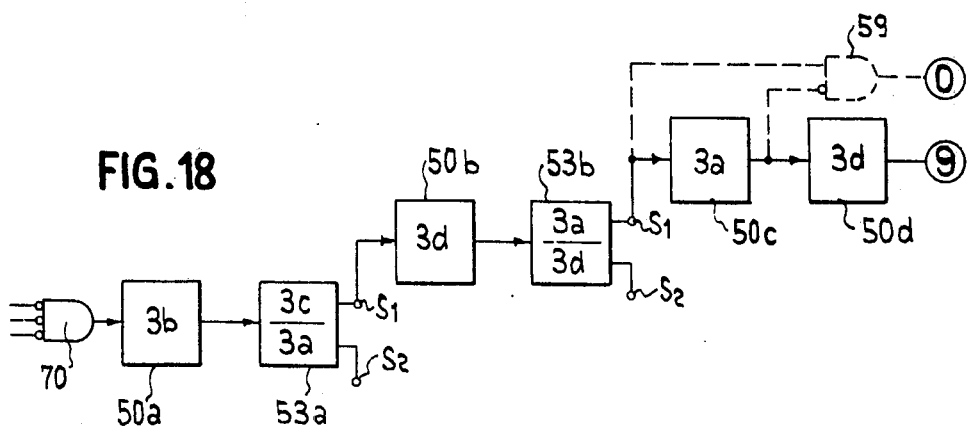
FIG. 18 is a portion of the circuit of FIG. 17 involved in a particular decoding sequence shown as example.

For an explanation of the functioning of the circuit 10, part of this circuit is shown in FIG. 18 which corresponds to the recognition of the numeric symbol 9, the writing sequence of which is given by FIG. 12.

Each unit 50 or 53 is represented symbolically by a square, the indication inside corresponding to the reference of the pick-up(s) which controls it. In order to render the diagram more comprehensible, the return-to-zero line which connects all the inputs $\overline{R}$ together has been omitted.

Assume that all the outputs of the units are in the 0 state which corresponds to the initial condition of the circuit; by this fact, the input E' of the circuit 50a is put in the state 1 by the gate 70; FIG. 28 shows that the passage to the logical state 1 of the input C9 (see FIG. 15) of the cell 50a which is controlled by the pick-up 3b, allows the output S of this cell to pass to the 1 state.

The writing sequence of the number nine is such that it is the electrode 3c which is subsequently activated. As the input E' of the switching unit 53a is now in the condition 1 and by virtue of the state table of FIG. 16b, the passage to the state 1 of the input C9 connected to the pick-up 3a has the effect of putting the outputs $S_1$ in the state 1 and blocking the output S2 at the output condition 0 so that any action on the electrode 3a does not modify the state of this unit.

It is now that the unit 50b which has the state 1 at its input E and the output of which passes to the state 1 when the pick-up 3d is activated. The process is continued thus until the sequence has been completed, the cell 50d having then its output at the state 1 which corresponds to the traced number nine.

Figure 26:
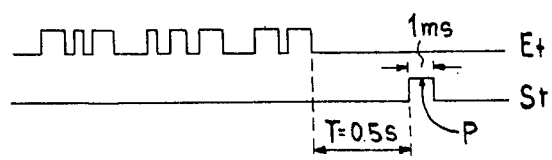
FIG. 26 shows what appears at the input and at the output of the resetting circuit.

The recognition circuit 10 must be reset so that a new symbol can feed in. This operation is effected by an end of sequence detector comprising an OR gate 8 having four inputs (see FIG. 2); the output of the gate 8 is in the logical state 1 each time that one of the pick-ups is activated, thus forming a series of impulses the number of which is equal to that of the steps of the input sequence; these impulses initiate the delay circuit 12, the output $S_t$ of which (see FIG. 26) provides, after a time T following the last input impulse, a return-to-zero pulse P.

These resetting means thus impose a minimal writing speed whilst the time separating two steps of the input sequence is smaller than T, fixed at 0.5 s.

Certain symbols have sequence such that they correspond to the beginning of the sequence of other symbols; it is thus necessary to provide a device which can differentiate them. In the preceding example, the sequence of the number nine contains that of the number zero, the sequence of this latter being 2, 3, 4, 1; thus if the number zero is traced, the gate 59 will have its direct input in the state 1 and its inverted input in the state 0, its output will take up the state 1 signifying that the symbol 0 has been traced.

The FIG. 17 shows the complete circuit with all the gates which permit the separation of the symbols the sequences of which are identical in a certain field.

The recognition of the symbols is effected in real time.

Certain symbols, such as the number nine (FIGS. 12 and 13), can be written in several ways, generating thus different sequences. The recognition circuit 10 permits recognition of the two possibilities.

Figure 9:
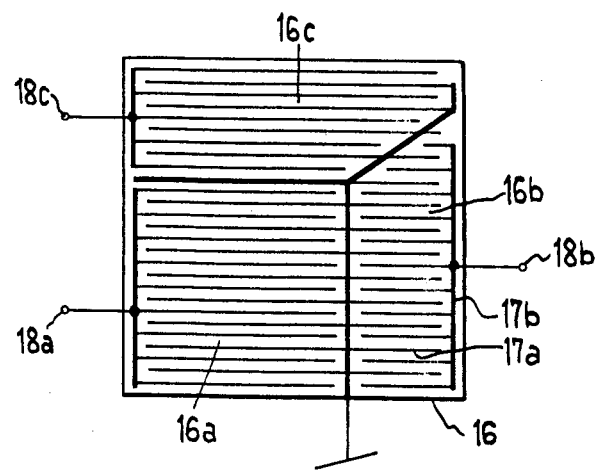

In another embodiment of the pick-ups shown in FIG. 9, the writing surface 16 is divided into three zones 16a, 16b and 16c which define three capacitive pick-ups having a relatively large surface, the pick-ups are constituted by an interdigital network of transparent electrodes 17a and 17b disposed on a glass support and covered with an oxide layer (insulating) resistant to wear and forming a dielectric.

The electrode 17a is earthed, each zone of electrode 17b constitutes the other armature of a capacitor, the capacitance of which between the terminals 18a, 18b, 18c and earth is modified by the presence of a finger on the writing surface. The tracing of the entering symbol provides a sequence of codes having three bits in the manner of the device described (see FIGS. 23 and 24).

FIG. 19 represents the block diagram of an electronic watch provided with a device for correction of the hour and the date, these latter being introduced by means of the writing surface 16 illustrated by FIG. 9.

The pick-ups 18a, 18b and 18c are connected to the detection circuits 109a, b and c. The outputs of these circuits control a logic circuit 19 which eliminates the false codes which appear when the operating finger simultaneously excites two pick-ups.

The output of the logic circuit 19 supplies a recognition circuit 10' of same principle as the circuit 10 previously described. The delay circuit 12 and the gate 8' having three inputs are similar to those previously described.

This watch includes a quartz crystal time base 135 providing impulses to a frequency divider 136, the output 150 of which controls a first preselection BCD counter 137a at a rate of one impulse per minute. This counter is the first of a reduction chain formed by the BCD preselection counters 137b, 137c, 137d, 140a, 140b, 140d which feed transcoders 138a, 138b, 138c, 138d, 141a, 141b, 141c, 141d themselves controlling the electro-optical displays 139a, 139b, 139c, 139d, 142a, 142b, 142c, 142d which respectively represent the minute, tens of minutes, hours, tens of hours, the days, tens of days, months and tens of months.

The preselection inputs 149a, 149b, 149c, 149d of the counters are controlled by a four bit parallel shift register 143 with series input 151 and parallel output. The clock input 148 of the register is provided by the line 148 of the recognition circuit 10'.

Figure 22:
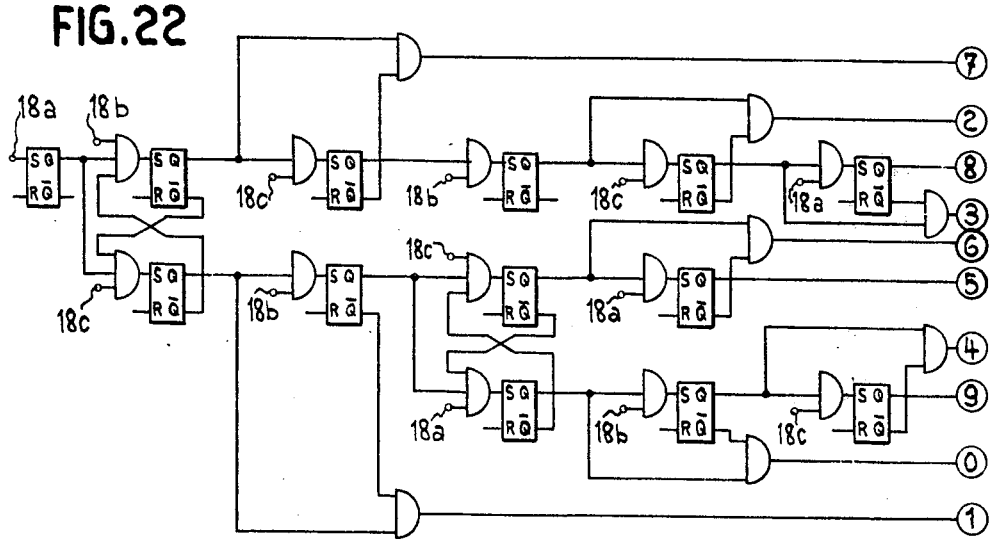
FIG. 22 shows the diagram of the recognition circuit 10' of FIG. 19.

The input of register 143 is controlled by a diode transcoder 144 itself controlled by the output 147 of the recognition circuit 10', represented in FIG. 22 where the indications 18a, 18b, 18c correspond to the zones of the capacitive pick-up 16. The charging of the preselection counters is ensured by the lines 145 and 146 which correspond to the output H and D of the recognition circuit; this latter being controlled by the writing surface 16 and the logic circuit 19.

Figure 23:
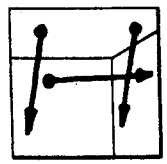
FIGS. 23 and 24 show the correction instructions for the hour and for the day.
Figure 24:
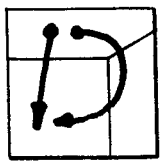

The correction of the hour or of the date is obtained by writing on the surface 16 which is the watch glass, the desired hour or date, followed by the symbol H or D in accordance with the desired correction being that of the hour or of the date. As soon as this synbol is traced the corrected indication is displayed. FIGS. 23 and 24 show the sequence corresponding to these instructions.

The functioning of the circuit is as follows.

The user writes on the surface 16 the hour or the date which he desires to make appear on the display of the watch, a correction comprising four numbers, for example 1 2 3 5 → 12h 35 min 1 7 0 8 → 17 August Each time a number is traced, the output 147 of the circuit 10' corresponding to this number takes the logic condition 1. The 10 numbers which it is possible to trace (see FIG. 22) activate a respective one of the 10 lines 147 which supply a transcoder 144 shown in part in FIG. 20. This transcoder 144, formed of a matrix or diodes 200, permits the passage of the input code 1 bit/symbol in an output code chosen here as being the BCD code the output being formed by the line 151A, 151B, 151C, 151D symbolized on FIG. 19 by the single line 151.

Each number traced is thus transformed into a word of four bits which is memorized in the shift register 143.

Figure 21:
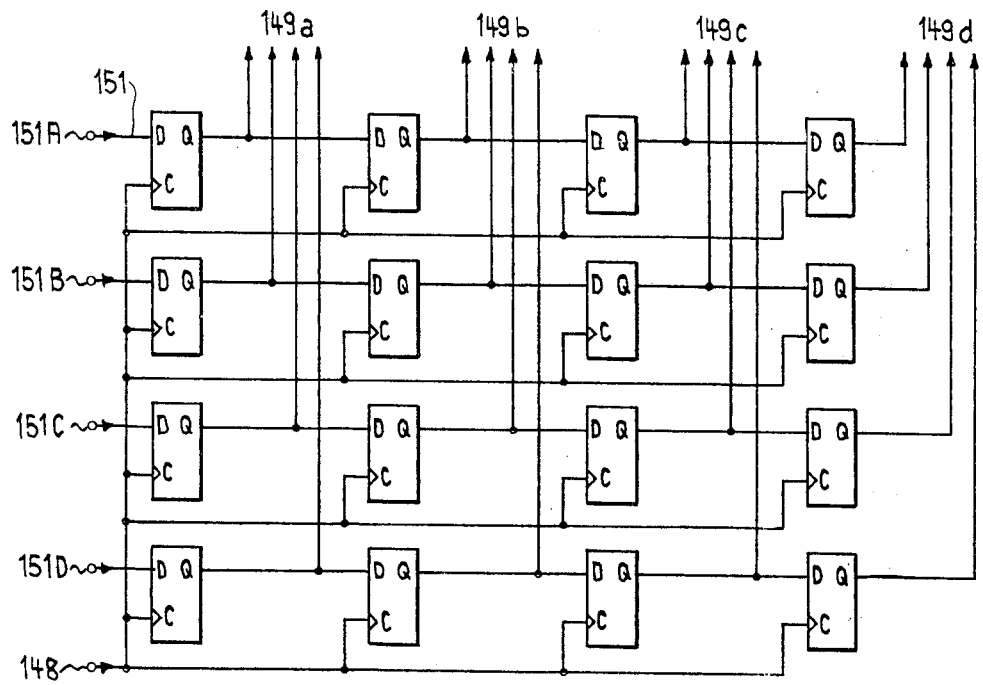
FIG. 21 shows a shift register.

This register is of a conventional type, shown in FIG. 21, and includes four parallel chains of D-type flip-flops 201, of which all the clock inputs C are connected together and controlled by the circuit 10'. Thus, at the end of the writing of each number, its associated BCD code appears on the output 149a, that of the preceding number on the outputs 149b etc.

When the four numbers are traced, the outputs 149a, 149b, 149c, 149d represent in coded form the number to be transferred into the preselection counters. This transfer is obtained by writing the symbol corresponding to the type of correction desired H (hour) or D (date), which has the effect of temporarily placing one or other of the lines 145 or 146, representing the symbols H or D, in the condition 1. These lines 145, 146 control the load inputs of the hour and date counters respectively.

Figure 10:
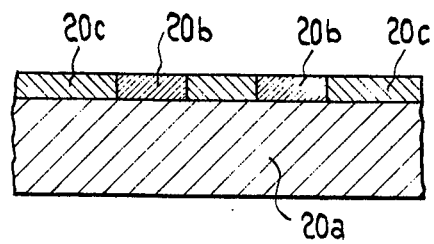
Figure 11:
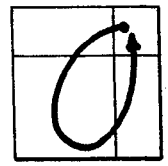
FIGS. 11, 12, 13 and 14 give several examples of writing of the symbols recognizable by the circuit proposed and the associated codes generated by the writing sequence.

Another possible embodiment of the writing surface uses the properties of resistive pick-ups. FIG. 10 represents a transverse section of a resistive pick-up.

Metallic electrodes 20b are disposed on a glass support 20a and covered by an insulator 20c coated on in the liquid state and hardened by heating. A polishing operation uncovers the surface of the electrodes.

Figure 25:
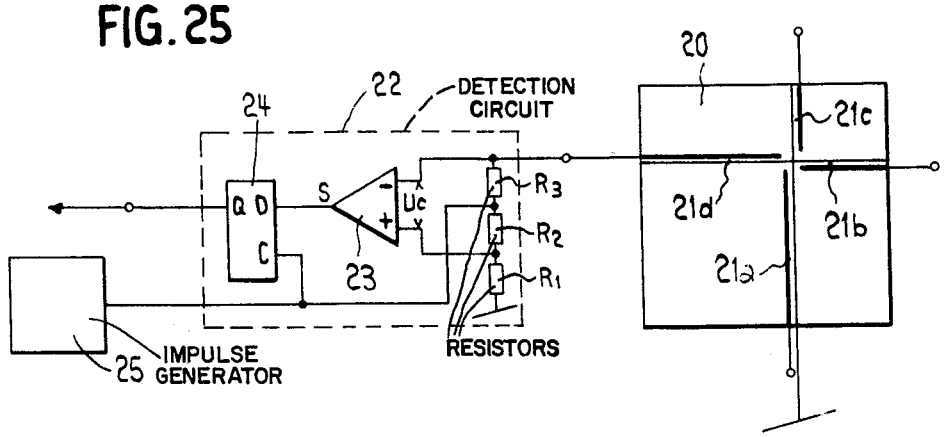
FIG. 25 shows one of the detection circuits and wave shaping for putting the data into logic form for a resistive pick-up.

In accordance with the diagram shown in FIG. 25, the writing surface 20 is split into four quadrants limited by the resistive pick-ups 21a, 21b, 21c, 21d. One electrode of each collector is connected to earth, the other to the detection circuit 22.

The resistance of one of the pick-ups and the three resistances $R_1$, $R_2$, $R_3$ form a Wheatstone bridge fed with a voltage by an impulse generator 25 (see FIG. 25). The resistance $R_2$ and $R_3$ have the same value (for example 100 K$\Omega$) and $R_1$ is such that $R_{pick-up} > R_1$ without the finger on the pick-up
$R_{pickup} < R_1$ with the finger on the pick-up.

The presence of a finger on the two electrodes of the pick-up reduces the resistance which exists between them, which is normally very high, to a value of the order of 10 K$\Omega$ to 1 M$\Omega$. One may select $R_1 = 2M\Omega$.

Figure 27:
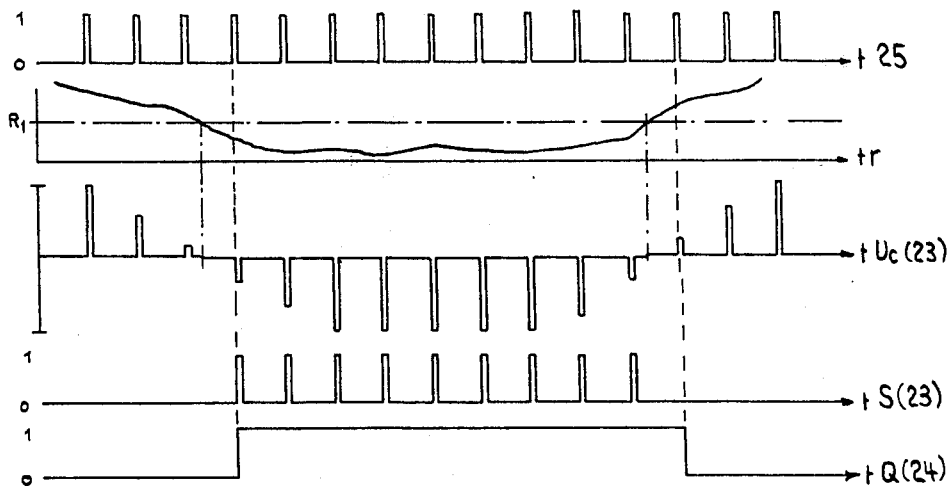
FIG. 27 is a diagram explaining the functioning of the detection circuit associated with the resistive pick-up.

In accordance with the value of $r_{pick-up}$ the voltage differential applied on the comparator 23 will be positive or negative with respect to its non-inverted input. In the case where a finger is not on the pick-up (see FIG. 27) this voltage is positive and the output of the comparator is in the condition 0. In the opposite case, the input voltage is negative and the output of the comparator provides identical impulses in phase with those of the generator,. A D-type flip-flop is controlled on its clock input by the generator and on its input D (DATA) by the comparator. At each positive transition of the clock signal, the condition of input D is transferred to the output Q. This output thus takes up the logic condition 1 during the whole of the duration of the presence of a finger on the pick-up and the logic condition 0 in the absence of a finger.

The output of the circuit 22 can then control the recognition circuit (10). Interest in pulsing the feed of the bridge is dictated by the small average consumption of current which results therefrom. The frequency of the generator 25 must be sufficient for several impulses to be detected when a finger touches a collector, in practice 100 Hz would suffice.

We claim:

1. A multi-functional electronic watch, comprising an electro-optical digital display means; circuit means coupled to said display means for measuring time; a data processing circuit coupled to said display means; a writing surface including a plurality of pick-up electrodes embedded in the glass of said watch, said pick-up electrodes delivering a series of signals corresponding to the given order in which each of them is excited when an alpha-numerical symbol is traced analogically on the surface of said glass, said series of signals forming a combinatory code; and interface means connecting said pick-up electrodes to said data processing circuit for recognizing said combinatory code and supplying data signals to said processing circuit, said data signals corresponding unequivocally to said symbol.

2. A multi-functional electronic watch according to claim 1, wherein said writing surface comprises a number N of said pick-up electrodes and wherein said interface means comprise a detecting and triggering circuit connected to each of said pick-up electrodes and a recognition circuit cooperating with a initializing circuit, the said number N of said detecting and triggering circuits delivering impulses forming a sequence comprising a certain number of words each having the same number N of bits, the outputs of said detecting and triggering circuits being connected to inputs of said recognition circuit, said recognition circuit converting said sequence so as to activate a corresponding one of its outputs in a logical state representing said data signal, the number of the outputs of said recognition circuit being equal to the number of symbols which can be entered with said pick-up electrodes.

3. A multi-functional electronic watch according to claim 2, wherein said initializing circuit comprises a delay circuit controlled by an OR gate, the inputs of said OR gate being connected in parallel with the outputs of said detecting and triggering circuits, the output of said delay circuit being connected to said recognition circuit for providing a return-to-zero pulse resetting said recognition circuit after a time T following the end of said writing sequence.

4. A multi-functional electronic watch according to claim 2, wherein said data processing circuit comprises a calculator circuit, a control circuit and a function selector circuit, the inputs of said calculator circuit being connected through said control circuit to the outputs of said recognition circuit, said function selector circuit being actuated in response to a particular symbol traced on said writing surface thereby to connect said calculator circuit to a power supply and, a certain time T' after a last arithmetic operation has been effected, to disconnect said calculator from said supply.

5. A multi-functional electronic watch according to claim 4, wherein said display means comprise a transcoder controlling a first display, the inputs of said transcoder being connected in parallel to the outputs of said recognition circuit, and a second display coupled with a multiplexer connected to the outputs of said calculator circuit, to said function selector circuit and to said circuit for measuring the time, said first display showing entering data, said second display showing the results of calculations if the function calculator is selected and showing the function of time if the function calculator is not selected.

6. A multi-functional electronic watch according to claim 5, in which said writing surface comprises three pick-up electrodes which permit corrections of the time and the date.

7. A multi-functional electronic watch according to claim 2, wherein said data processing circuit comprises diode transcoder means connected to the outputs of said recognition circuit, said diode transcoder means controlling a shift register connected to preselection counter feeding transcoder circuits which drive the digits of said digital display means, the clock inputs of said shift register being controlled by said initialization circuit, said preselection counters being connected in cascade and the first of them being fed by impulses issuing from said circuit for measuring the time.

8. A multi-functional electronic watch according to claim 1, wherein said pick-up electrodes react to the passage of an operator's finger when the operator traces a symbol on the surface of said glass.

9. A multi-functional electronic watch according to claim 1, wherein each of said pick-up electrodes is sensitive to a change of its capacity and is formed by pairs of conductive layers deposited on the surface of a first glass, a thin plastic film and a second glass covering said first glass so that the whole constitutes the watch-glass after assemblage.

10. A multi-functional electronic watch according to claim 1, in which said pick-up electrodes extend radially from a point of origin, the position of which is eccentric with respect to the center of said watch-glass.

11. A multi-functional electronic watch according to claim 1, in which the area of said writing surface is divided into zones which define capacitive pick-ups combined by an inter-digital network of transparent electrodes disposed on a glass support and covered by an insulating layer.

12. A multi-functional electronic watch according to claim 1, in which said pick-up electrodes are sensitive to a change of their electrical resistance and are formed by a metallic layer disposed on a glass support which is covered by an insulator and polished in order to have the surface of said electrodes on the same plane as the face of said watch-glass.

13. A multi-functional electronic watch according to claim 1, in which said writing surface comprises four electrodes which permit the numerical symbols 0 to 9, the instructions +, −, ×, ÷, =, and the letter C to enter.

* * * * *